United States Patent [19]

Choi

[11] Patent Number: 5,561,385

[45] Date of Patent: Oct. 1, 1996

[54] INTERNAL VOLTAGE GENERATOR FOR SEMICONDUCTOR DEVICE

[75] Inventor: Go-Hee Choi, Seoul, Rep. of Korea

[73] Assignee: LG Semicon Co., Ltd., Cheongju, Rep. of Korea

[21] Appl. No.: 419,212

[22] Filed: Apr. 10, 1995

[30] Foreign Application Priority Data

Apr. 8, 1994 [KR] Rep. of Korea ................ 94-7354

[51] Int. Cl.⁶ ..................................................... G05F 1/10
[52] U.S. Cl. ............................................. 327/536; 327/537
[58] Field of Search .................................. 327/534, 535, 327/536, 537

[56] References Cited

U.S. PATENT DOCUMENTS

| | | | |
|---|---|---|---|
| 4,547,682 | 10/1985 | Bialas et al. | 327/536 |
| 4,656,369 | 4/1987 | Lou | 327/536 |
| 4,775,959 | 10/1988 | Sato et al. | 365/189.09 |
| 4,794,278 | 12/1988 | Vajdic | 327/537 |
| 4,964,082 | 10/1990 | Sato et al. | 365/189.09 |
| 4,985,869 | 1/1991 | Miyamoto | 365/226 |
| 5,003,197 | 3/1991 | Nojima et al. | 327/536 |
| 5,034,625 | 7/1991 | Min et al. | 327/536 |
| 5,426,334 | 6/1995 | Skovmand | 327/536 |

*Primary Examiner*—Margaret Rose Wambach
*Attorney, Agent, or Firm*—Alan R. Loudermilk

[57] ABSTRACT

An internal voltage generator for a semiconductor device, for generating an internal voltage within the device which may include: a charge pump generating a DC voltage by rectifying clock signals; a variable frequency oscillator generating variable oscillation frequency clock signals in accordance with control signals; and a voltage control means detecting the level of a voltage maintained by the output voltage of the charge pump so as to generate control signals for controlling the variable frequency oscillator.

20 Claims, 4 Drawing Sheets

INTERNAL VOLTAGE GENERATOR FOR SEMICONDUCTOR DEVICE

FIELD OF THE INVENTION

The present invention relates to internal voltage generators for semiconductor devices, and more particularly to an internal voltage generator that is provided with a voltage control means for controlling the charge pumping rate by linearly varying the oscillating period during the charge pumping, so that the voltage generator can be used as a back bias voltage generator, as an internal high voltage (VPP) generator, or as an internal power voltage (Vcc) generator, etc.

BACKGROUND OF THE INVENTION

In semiconductor devices, a voltage different from the externally supplied voltage sometimes is required. One example of such a voltage is the back bias voltage which is supplied to the substrate of a MOS device for improving the reliability by reducing the influence of variations in temperature and the external voltage source. Another example is a high voltage supplied to a word line of a memory cell for preventing a voltage drop in the transistor of the memory cell during selection of the word line.

U.S. Pat. No. 4,775,959 discloses an internal back bias voltage generator, which is one type of a conventional voltage generator.

As illustrated in FIG. 2, this back bias voltage (Vbb) generator includes first Vbb generator G1 and second Vbb generator G2. First Vbb generator G1 includes first oscillating section OSC1 and rectifying section REC, and second Vbb generator G2 includes second oscillating section OSC2 and rectifying section REC. First Vbb generator G1 and second Vbb generator G2 are composed of voltage generating circuits as illustrated in FIG. 1.

The three NAND gates are series connected as illustrated, with an output connected to a first input of the succeeding NAND gate, and the output of the last NAND gate connected to the first input of the first NAND gate, so that the generated signals should circulate, thereby forming an oscillator. The output of this oscillator is supplied through buffer circuit 12 to a first electrode of pumping capacitor C1. A rectifier is connected from a second electrode of capacitor C1 to transistors 16 and 17, which serve as rectifying elements.

The second input terminals of three NAND gates NAND1, NAND2 and NAND3 are commonly connected to an oscillator enable signal. The pumping capacitor of second Vbb generator G2 has a large capacitance, while the capacitor of first Vbb generator G1 has a relatively small capacitance.

As to the voltage generating operation of this circuit, when the power source Vcc is supplied, and when oscillator enable signal EN for activating oscillator OSC is input into the second input terminal of NAND gates, an oscillating output is generated.

If the oscillating output signal has a high level, the signal passes through buffer circuit 12 (driving the pumping capacitor) so as to make first electrode 14 of pumping capacitor C1 high. Under this condition, second electrode 15 of pumping capacitor C1 rises to a high level due to the coupling action of the capacitor.

If the potential of second electrode 15 of the pumping capacitor is higher than the positive terminal (ground potential GND), then first rectifying device 16 is turned on, so as to be connected with the positive terminal.

If the oscillation output signal is shifted to a low level, the low voltage is transmitted through buffer circuit 12 for driving first electrode 14 of the pumping capacitor so as to make it low. At the same time, the second electrode of the pumping capacitor also is shifted to a low level due to the coupling effect.

The potential of second electrode 15 of the pumping capacitor becomes lower than the positive terminal, so that first rectifying device 16 is turned off. If the potential of second electrode 15 of pumping capacitor 15 becomes lower than the negative terminal (e.g., back bias potential −Vbb), then second rectifying device 17 is turned on, so as to be connected to the potential of the negative terminal.

The oscillation output signal becomes high again, and this operation is repeated, with the result that electrons of the positive terminal are moved toward the negative terminal, thereby carrying out a pumping operation, and generating a voltage.

First Vbb generator G1 thus generates negative voltage, but the negative voltage is weak to a degree that it should be able to compensate only leakage of the transistors when the chip is not operating, such as during a standby state. On the other hand, the generation of the negative voltage by second Vbb generator G2 is much larger to such a degree that it should be able to compensate leakage of the transistors during normal operation of the semiconductor device.

If the voltage generation capability is to be increased, the capacity of the buffer circuit which drives the pumping capacitor has to be increased, and, at the same time, the capacitance of the pumping capacitor and the capacity of the rectifying device have to be increased.

Further, when power is supplied initially to the chip, in order to step up the back bias voltage to the desired level, a boost pump sometimes is used. This is for detecting the initial power supply by means of a power-up detector, so that the oscillating frequency should be increased, and the pumping operation should be made faster.

In the circuit of FIG. 2, if the negative voltage is continuously supplied, and, thus, if the Vbb voltage comes down to a certain level, then a back bias voltage detecting signal is emitted by a back bias voltage detecting section (VLD section), so that the voltage generator enable signal should not be supplied, thereby maintaining the voltage at a constant level.

U.S. Pat. Nos. 4,794,278, 4,964,082 and 4,985,869 disclose other back bias voltage generators. In these conventional techniques, however, if the chip is put in a standby state, most of the transistors are turned off, but equalizers and pre-charge transistors operate, with the result that the amount of the leakage current is relatively small. In this state, the Vbb generator with a small driving capability is operated, thereby reducing the power consumption. If the chip becomes active, or if the Vbb voltage level does not reach a certain level (−3Vth), the Vbb generator which has a large driving capacity is operated, thereby preventing the Vbb voltage from rising due to the increase in the leakage current during activation of a large number of transistors.

In this conventional voltage generator, the oscillation period is fixed, and, therefore, it cannot respond accurately to the leakage current which is generated from the plurality of the transistors in which the operating conditions are changed between active and standby positions. Therefore, the oscillation period has to be determined by calculating the average value of the leakage current, and the peak current for driving the charge pumping capacitor may be increased, with the result that voltage variation may occur, thereby degrading the reliability of the semiconductor device.

In controlling the operation of the conventional back bias generator, the turning-on/off is controlled at a proper time under control of the timing control circuit. Thus, there are provided a plurality of oscillators which have different frequency ranges and which operate in accordance with the operating state of the circuits. The plurality of the oscillators are controlled so as to obtain suitable oscillating frequencies, and negative voltages thereby are obtained. Therefore, a plurality of oscillators and control circuits are required, and, therefore, the constitution of the circuit becomes complicated. Further, the voltage generator cannot be controlled in a linear manner, and, therefore, it becomes difficult to precisely control the Vbb voltage.

SUMMARY OF THE INVENTION

The present invention is intended to overcome the above described disadvantages of the conventional techniques.

It is an object of the present invention to provide an internal voltage generator for a semiconductor device in which the voltage generator is provided with a voltage control means for controlling the charge pumping rate by linearly varying the oscillation period during charge pumping, so that the voltage generator can be used as a back bias voltage generator, as an internal high voltage (VPP) generator, or as an internal power voltage (Vcc) generator.

The voltage generator of the present invention is characterized in that the oscillation period is linearly controlled to adjust the pumping rounds and to linearly respond to the variation of the load, unlike the conventional voltage generator, in which a proper charge pump is selected from among large capacity charge pumps and small capacity charge pumps during standby, operating and power-up states.

According to the present invention, therefore, a relatively large capacitor is not needed, and the transistor for driving the capacitor does not have to be large. Therefore, the peak current can be reduced, and the oscillation period can be adjusted in accordance with the state of the device, so that the amount of pumped charge per unit of time can be arbitrarily adjusted to a larger or smaller amount.

A semiconductor internal voltage generator for generating the required voltage within the device according to the present invention includes: a charge pump for generating a DC voltage by rectifying clock signals; a variable frequency oscillator for generating variable oscillation frequency clock signals in accordance with control signals; and a voltage control means for detecting the level of voltage maintained by the output voltage of the charge pump so as to generate control signals for controlling the variable frequency oscillator.

The variable frequency oscillator includes: an oscillator formed by connecting an odd number of inverting devices; and a power control means for controlling the supplying of power to the respective inverting devices in accordance with the control signals. The power control means is characterized in that a MOS transistor is installed between the inverting devices and the power source, and the amount of supplied current is controlled by connecting the gate voltage of the MOS transistor to the control signals. The oscillation frequency of this variable frequency oscillator is linearly varied in accordance with the control signals.

The voltage control means includes: a voltage level detector for generating signal voltages by detecting the difference between the reference voltage level and the internal voltage; and an oscillation control section for receiving the signal voltage of the voltage level detector to generate control signals in the form of a current voltage in accordance with the magnitude of the signal voltage.

The oscillation control section includes: an MOS transistor for receiving the signal voltage into its gate to cause the flow of voltage detecting current Idet; and a current mirror for making control current Ictl flow proportionately to current Idet. The current mirror includes a first current mirror for receiving voltage detecting current Idet to cause the flow of control current Ictl and to generate a current voltage in accordance with current Ictl; and a second current mirror for receiving control current Ictl to generate a current voltage in accordance with current Ictl.

It will be more effective if there is provided a driving circuit which includes an inverter for amplifying the oscillation wave pattern between the variable frequency oscillator and the charge pump to generate rectangular waves.

The voltage level detector includes a plurality of pMOS transistors and a plurality of nMOS transistors, wherein the first pMOS transistor is connected to the power source, and the last nMOS transistor is connected to an internal voltage terminal.

Further, the variable frequency oscillator can be constituted such that: the odd number of inverting devices are connected in series; the output side of the inverting devices is connected to a set input terminal of a flip-flop; the input side of the inverting devices is connected to a Q output of the flip-flop; another set of inverting devices (odd number) are connected in series; the output side of these inverting devices is connected to the reset input of the flip-flop; and the input side of these inverting devices is connected to a *Q output of the flip-flop.

In this case, the power source is supplied to one of the inverting devices in a controlled manner, while a capacitor is disposed between one of the output sides of the inverting devices and the ground. Therefore, the oscillation frequency is varied in accordance with the size of the capacitor and the amount of the controlled, supplied power.

The inverting devices includes pMOS transistors and nMOS transistors connected in series.

The voltage control means includes: a voltage level detector for detecting the difference between the reference voltage level and the current internal voltage to generate a signal voltage; and an oscillation control section for receiving the signal voltage of the voltage level detector to generate a control current in accordance with the magnitude of the signal voltage. The oscillation control section includes: an MOS transistor for receiving the signal voltage into its gate to cause the flow of voltage detecting current Idet; and a current mirror to cause the flow of control current Ictl proportionately to current Idet.

The inverting device which receives the control power source is the first inverter, and the first inverter receives the controlled current through the current mirror of the oscillation control section.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

Figure 1:
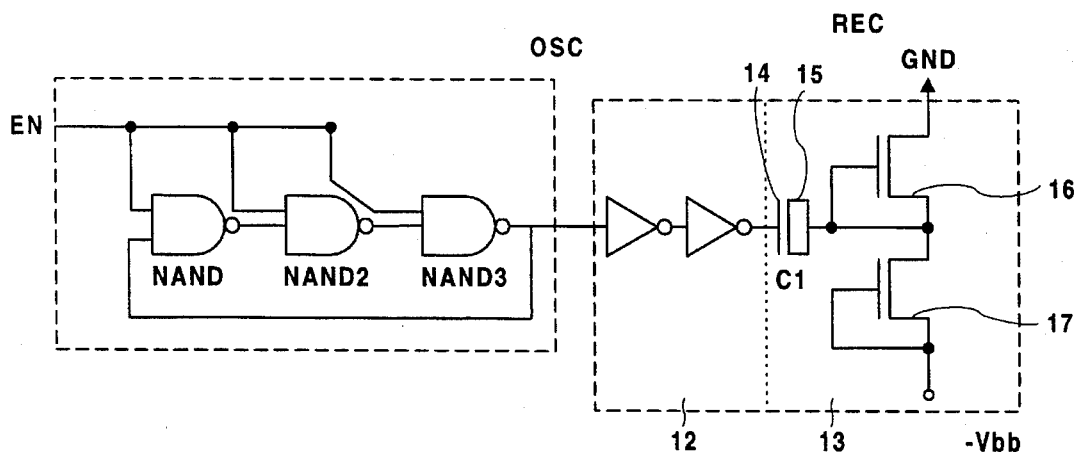
FIG. 1 is a circuit illustration of a voltage generator used in a conventional semiconductor memory device.
Figure 2:
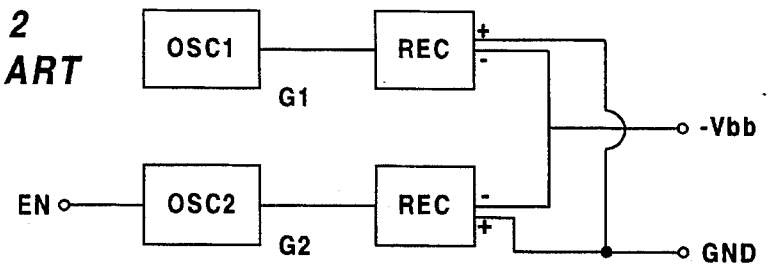
FIG. 2 is a block diagram illustrating a constitution of an internal back bias voltage generator of a conventional semiconductor memory device.
Figure 3:
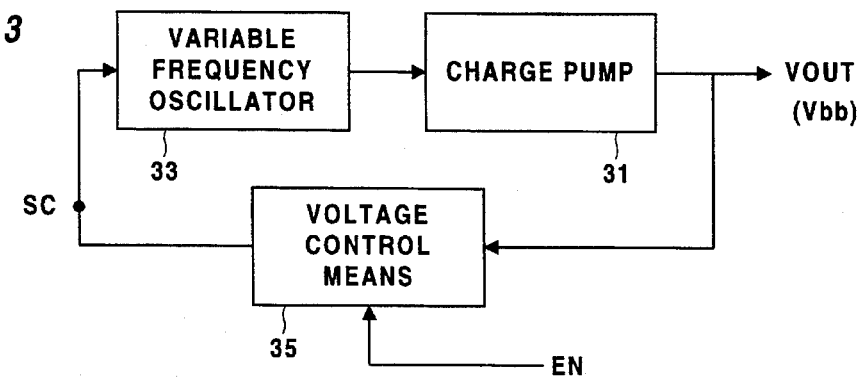
FIG. 3 is a block diagram illustrating the constitution of an internal voltage generator for a semiconductor device according to the present invention.
Figure 4:
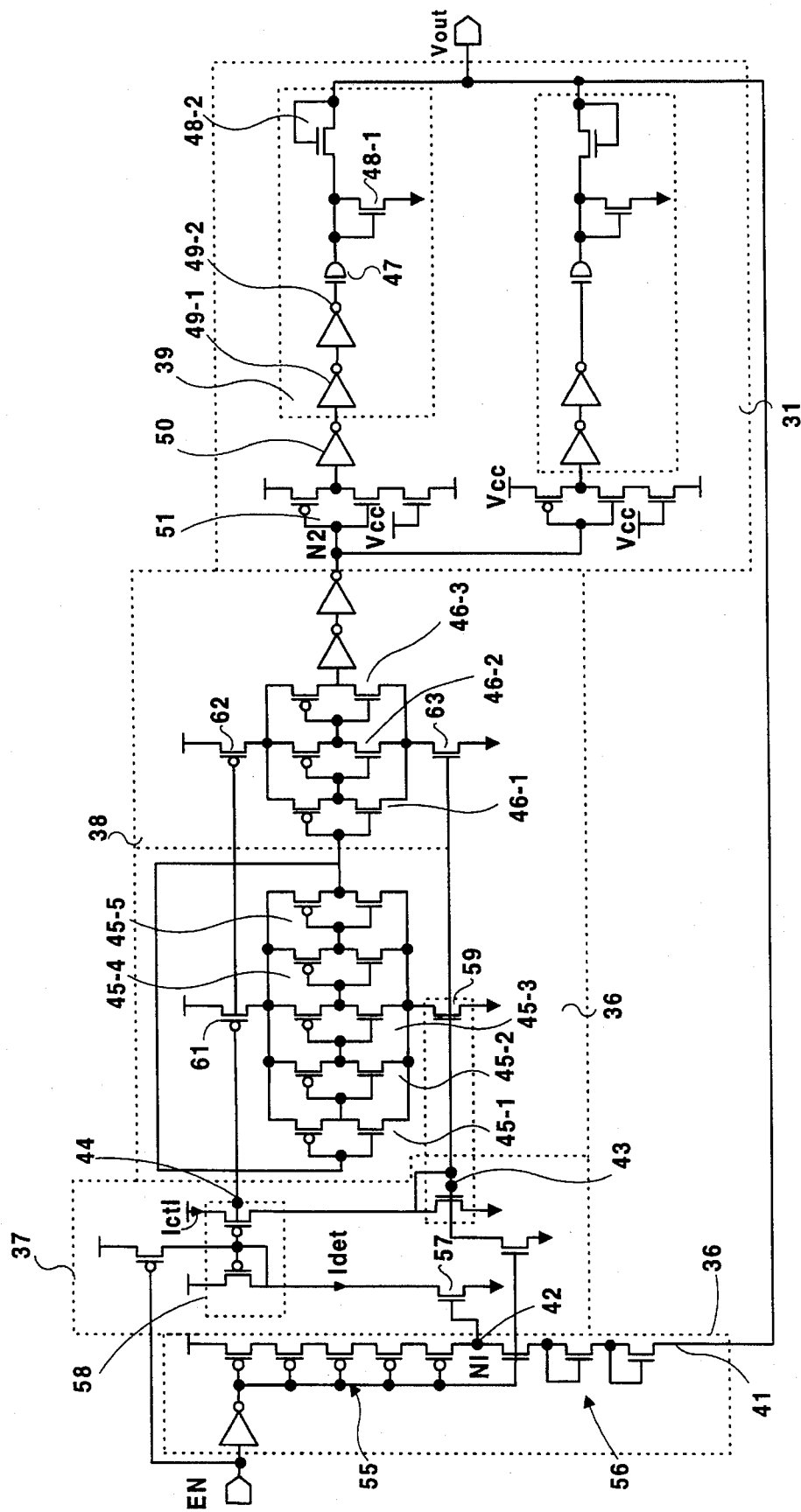
FIG. 4 is a circuit illustration of an internal voltage generator for a semiconductor device according to the present invention.
Figure 5:
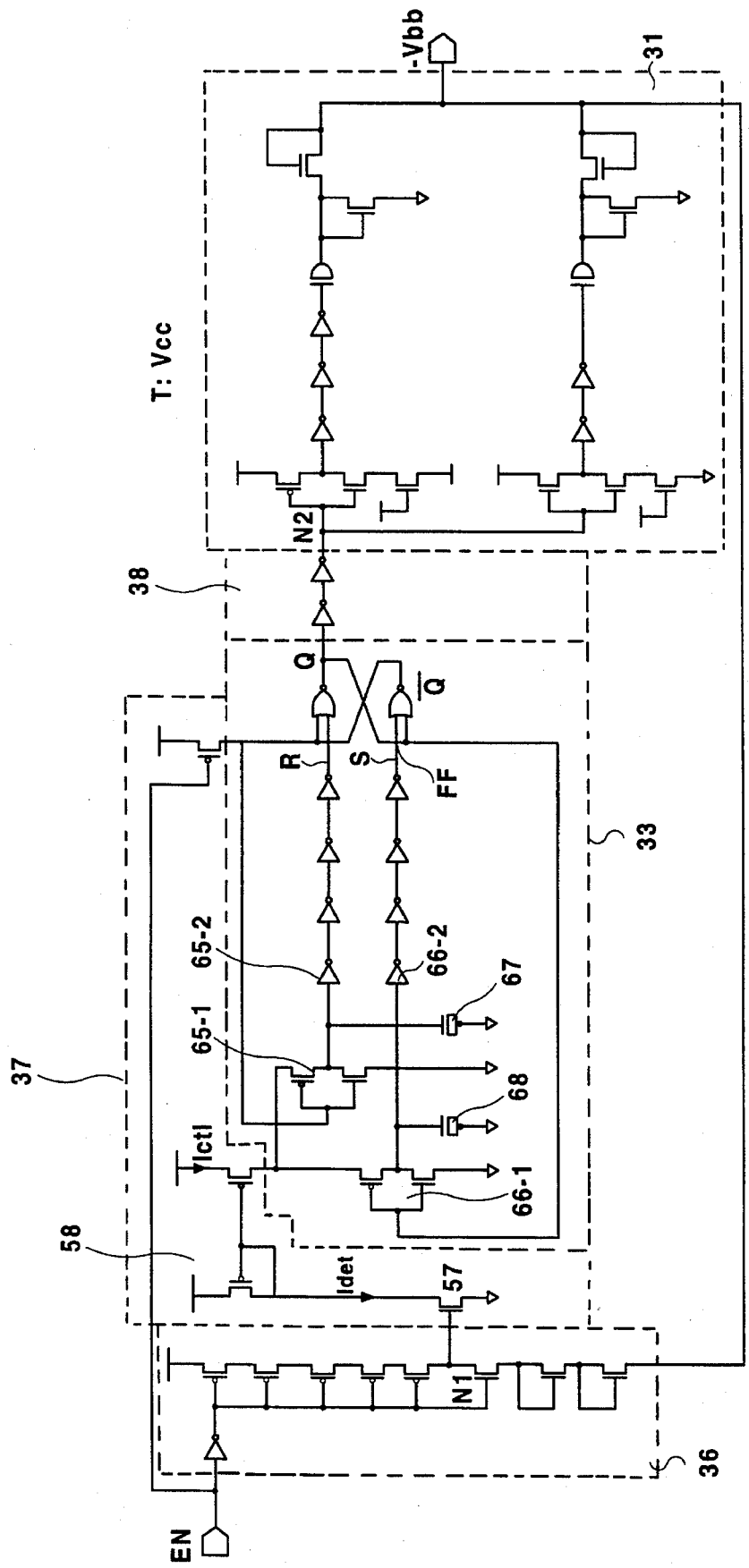
FIG. 5 is a circuit illustration of an internal voltage generator according to another embodiment of the present invention.
Figure 6:
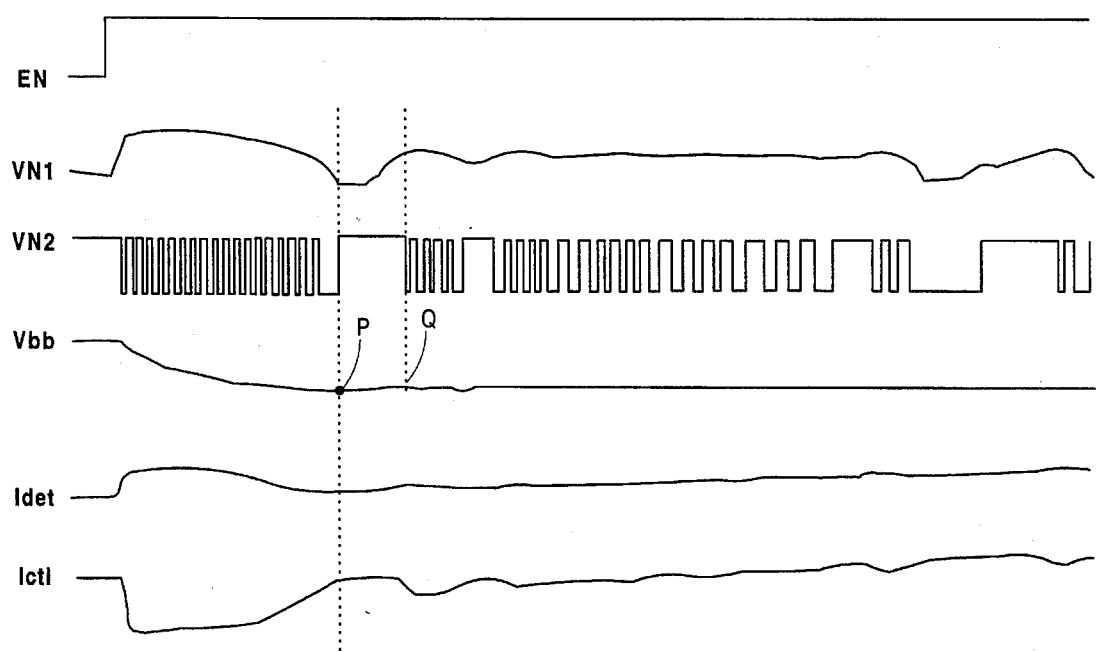
FIG. 6 illustrates wave patterns for the principal signals according to the present invention.

FIG. 3 is a block diagram illustrating the constitution of an embodiment of the present invention, FIG. 4 is a circuit illustration thereof, FIG. 5 illustrates another embodiment of the present invention, and FIG. 6 is an operation timing chart for the back bias voltage generator of FIG. 4.

As illustrated in FIG. 3, the semiconductor internal voltage generator includes: charge pump 31 for generating a DC voltage by rectifying clock signals; variable frequency oscillator 33 for generating variable oscillation frequency in accordance with control signals; and voltage control means 35 for detecting the level of voltage Vout maintained by the output voltage of the charge pump so as to generate control signals for controlling the variable frequency oscillator.

The variable frequency oscillator carries out the oscillating operation by feeding back the output of an inverting device which inverts the input signals. When the signals pass through the inverting device, the time is controlled so as to vary the oscillation frequency. That is, if the signal transmission time of the inverting device is extended, then the clock frequency is decreased, while if the signal transmission time is shortened, the clock frequency is increased.

The charge pump is composed of a pumping capacitor and a rectifying device as in the conventional technique, while the voltage control means generates control signals in accordance with the magnitude of the output voltage.

Therefore, if the output voltage (e.g., Vbb) which is desired to be maintained at a certain level is not at the certain level, the voltage control means enlarges the control signals, so that the frequency of the variable frequency oscillator should be increased, and the power for the charge pumping should be increased. If the output voltage (e.g., Vbb) arrives at the certain level, the voltage control means reduces the magnitude of the control signals, so that the frequency of the variable frequency oscillator should be reduced, and the amount of charge pumping should be reduced. Further, in accordance with the magnitudes of the difference between the reference level and the output voltage, the voltage control means generates the control signals in a large magnitude and or in a small magnitude, thereby increasing or decreasing the frequency of the variable frequency oscillator. Thus, the power for the charge pumping is adjusted, and the relevant voltage is maintained closely to the reference voltage. In the case where the voltage Vout which is needed within the semiconductor device is the back bias voltage Vbb, the circuit for generating the back bias voltage is illustrated in FIG. 4.

As illustrated in FIG. 4, in the back bias voltage generating circuit, voltage control means 35 which generates the control signals S for the variable frequency includes level detecting section 36 and oscillation control section 37.

Input terminal 41 of level detecting section 36 is connected to a Vbb terminal, and output terminal 42 of level detecting section 36 is connected to oscillation and drive control section 37. Output terminals 43 and 44 of oscillation and drive control section 37 are connected to the control input terminals of oscillator 33 and driving circuit 38. In order to control oscillation control section 37 and level detector 36, a Vbb enable signal EN is connected as illustrated.

In the disclosed embodiment, variable frequency oscillator 33 is composed of 5 inverters 45 (45-1, . . . 45-5) which are connected in series like a chain as illustrated. The number of inverters should be one or more, and should be an odd number. Alternatively, the oscillating circuit may be composed of a Schmidt trigger or R-C circuits.

A driver circuit is disposed between the variable frequency oscillator and the charge pump. This driver circuit is not necessarily required, but is a further optimization of the circuit.

Driver circuit 38 usually includes a high gain buffer circuit, and in this circuit also, one or more inverters are connected in series. In this embodiment, three inverters 46 (46-1, 46-2, and 46-3) are connected in series.

Charge pumping circuit 31 is usually composed of capacitors and diodes, and, in this embodiment, charge pumping circuit 31 includes: pumping capacitor 47, and rectifying section 39 consisting of two transistors 48-1 and 48-2, and buffering inverters 49-1 and 49-2. Rectifying section 39 is installed in the number of two, so that they can work alternately, thereby doubling the pumping capacity. For this purpose, inverter 50 is disposed in series, and transmitting switch 51, which is activated by Vcc so as for it to perform the pumping operation after supplying of power source Vcc, is connected in series with the two rectifying sections.

Level detecting section 36 utilizes the threshold voltage Vth of a MOS transistor, and, as illustrated, 5 pMOS transistors 55 and 3 nMOS transistors 56 are connected in series to Vcc. Two nMOS transistors on the side of the −Vbb terminal are connected such that the gate is connected to the drain, so that the transistors may be used as a diode for obtaining a voltage drop as much as Vt. The signal output of the level detector is output from the connecting point of the pMOS transistors and a third nMOS transistor, i.e., from the −Vbb terminal, which is a node for generating a voltage higher than the −Vbb, by 3 Vth. Alternatively, the level can be detected by utilizing reference signals.

Oscillation control section 37 includes voltage current converter 57 and current amplifier 58.

The circuit of the present invention constituted as above will now be described as to its operation.

Oscillator 33 generates rectangular waves of a proper frequency. These waves are sufficiently amplified by driving circuit 38, and the wave pattern is shaped. Charges are pumped into the substrate by charge pumping circuit 31, and the negative voltage −Vbb is generated. Level detector 36 detects the −Vbb level, and by utilizing this, and, by utilizing the level detected by oscillation control section 37, a control signal is generated for controlling oscillator and driving circuit 37, with the result that a proper overall Vbb level can be maintained. Such a control of the whole system is carried out by Vbb enable signal EN.

If enable signal EN which is supplied to the Vbb enable terminal of the voltage control means is shifted from low to high, then the back bias voltage generator starts operation. First, if the power is turned on, the substrate voltage is detected to be about the Vss level, and, therefore, the output signal of node N1 of output terminal 42 of level detector 36 has a high level. This signal is input into the input terminal of oscillating and driving circuit 37, and, therefore, becomes the voltage of the gate of MOS transistor 57, which is connected between Vss and current detecting node I. MOS transistor 57 is sufficiently turned on, so that maximum current Idet should flow. Further, this current is amplified by first current mirror 58, and current Ictl flows to second current mirror 59. Consequently, the power current for driving the oscillator flows in the maximum rate owing to the current voltage of nMOS transistor 63, which is commonly connected with the gates of second current mirror 59, and owing to the current voltage of pMOS transistors 61 and 62, which are commonly connected with first current mirror 58. Consequently, the operation of inverters 45 is made faster, with the result that rectangular waves equivalent to the maximum oscillating frequency of the oscillator are output. These rectangular waves are amplified by driving circuit 38 to supply the amplified waves to charge pump 31, so that the level of the Vbb voltage should be lowered. The current flow through inverters 46 is controlled, or limited, in accordance with the gate voltages of transistors 62 and 63.

The Vbb voltage is detected by level detector 36 by utilizing the Vth of the MOS transistor, and the detected voltage is fed back to the oscillation control section so as to control current Idet. This current is amplified to control current Ictl, thereby controlling the oscillation frequency of the oscillator.

That is, until before the Vbb voltage level drops to below Vth of the three MOS transistors, node N1 is maintained high in level detector 36, so that current Ictl can be maintained at its maximum value in the oscillation control section. Thus, the oscillation frequency of oscillator 33 is maintained at the maximum level, and the charge pumping rate is increased, so that the voltage level should approach the Vbb voltage level in a fast manner. When this voltage level is detected by the level detector, the voltage of node N1 is stepped down proportionately to the Vbb level, and consequently, currents Idet and Ictl are reduced. Therefore, the operating speed of the inverters of the oscillator slows, and the oscillation frequency is reduced, with the result that the charge pumping rate is reduced.

Therefore, if the Vbb voltage is maintained at a predetermined level, current Idet falls toward zero, with the result that the oscillating operation of the oscillator is stopped. Accordingly, the power consumption of the circuit also is reduced.

After the voltage is stabilized, the chip may be put to an active state, and the load on the Vbb voltage varies in accordance with the operation of the circuit, with the result that the Vbb voltage is varied. The voltage of node N1 in the level detector varies, so that current Ictl also varies. Therefore, the oscillation frequency of the oscillator varies, so that the Vbb level should be brought again to the predetermined level. Such controls may be carried out in an approximately linear manner in accordance with the operation state of the circuit, and in accordance with the variation of the load.

FIG. 6 illustrates wave patterns of the principal signals of the circuit of FIG. 4.

If signal EN becomes high, the voltage of node N1 is shifted to high as illustrated with the $V_{N1}$ wave pattern, while currents Idet and Ictl flow with the illustrated magnitude. The oscillator is activated, and the voltage of node N2 oscillates at a higher frequency as illustrated with wave pattern $V_{N2}$, while the Vbb voltage Vbb drops. When the Vbb voltage reaches point P, current Ictl becomes zero, so that the oscillation should stop. When the Vbb voltage rises to reach point Q, the oscillation starts again, and, from this point, the oscillation frequency varies in accordance with the rising of the Vbb voltage.

FIG. 5 illustrates a second embodiment of the present invention.

In this circuit, variable frequency oscillator 33, oscillation control section 37 and driving circuit 38 differ somewhat from the embodiment of FIG. 4, while charge pump 31 and level detector 36 are the same as the embodiment of FIG. 4.

Variable frequency oscillator 33 includes a plurality of inverters, and one flip-flop FF. An output Q of the flip-flop is connected back through plurality of inverters 66-1, 66-2, . . . to a set input S of the flip-flop. An output *Q of the flip-flop is connected through a plurality of inverters 65-1, 65-2, . . . to a reset input R of the flip-flop. Among the inverters through which the input passes, the power source which is supplied to first inverters 65-1 and 66-1 is connected in such a manner that current Ictl of the oscillation control section flows into the power terminal of these inverters. Further, a capacitor is connected between each inverter output and Vss. In this variable frequency oscillator, the state of the flip-flop is changed between set and reset continuously so as to ultimately generate an oscillating signal.

Oscillation control section 37 includes only a first current mirror, and current Idet flows due to the voltage of node N1 of voltage level detector 36, while this current causes current Ictl to flow.

The circuit constituted as above will now be described as to its operations.

Oscillator 33 may generate rectangular waves of a proper frequency, and these waves are sufficiently amplified and shaped by driving circuit 38. Charges are pumped into the substrate by charge pumping circuit 31, so that negative voltage –Vbb is generated. Level detector 36 detects the level of negative voltage –Vbb. By utilizing the detected level, oscillating and driving control circuit 37 generates control signals and currents for controlling the oscillator and the driving circuit. Thus, the overall Vbb voltage can be maintained at a proper level, and the control of the whole system may be carried out by means of Vbb enable signal EN as previously described.

When enable signal EN, which is supplied to the Vbb enable terminal of the voltage control means, is shifted from low to high, the back bias voltage generator begins operation. When the power source is turned on, the signal of node N1 of output terminal 42 of level detector 36 outputs a high level because the substrate voltage is close to the Vss level. This voltage is supplied to the input side of oscillation and driving circuit 37, which becomes the voltage of the gate of MOS transistor 57, which is connected between Vss and the current detecting node. MOS transistor 57 thus is sufficiently turned on, so that maximum current Idet should flow. This current is amplified by first current mirror 58 causing current Ictl to flow. That is, current Ictl, which causes the oscillator to operate flows at the maximum rate, so that capacitors 67 and 68 should be charged at a fast rate. Consequently, rectangular waves of the maximum frequency are output from the oscillator. These rectangular waves are sufficiently amplified by driving circuit 38 to supply them to charge pump 31, so that the Vbb voltage level should quickly drop. This reduced Vbb voltage level is detected by level detector 36 by utilizing the Vth of the MOS transistors and fed back to the oscillation control section, thereby controlling current Idet. This current is amplified to control current Ictl, and thus the oscillation frequency of the oscillator is controlled.

The voltage of node N1 is maintained at a high level until the Vbb voltage level drops below the 3 MOS Vth's in level detector 36. Thus, current Ictl is maintained at the maximum level in the oscillation control section, so that the oscillation frequency of oscillator 33 should be maintained at the maximum level, and the charge pumping rate should be increased. Consequently, the Vbb voltage level is quickly reduced. If the desired voltage level is detected by the level detector, then the voltage of node N1 is stepped down proportionately to the Vbb level. Therefore, currents Idet and Ictl are decreased, and the operating speed of the oscillator slows. The oscillation frequency is reduced, and the charge pumping rate also is reduced.

Therefore, if the Vbb voltage is maintained at the predetermined level continuously, then current Idet goes toward zero, and the oscillating operation of the oscillator stops, so that the power consumption of the circuit is decreased.

After stabilization of the voltage, the chip may be put in an active state, and the load on the Vbb voltage varies in accordance with the operation state of the circuit so as to vary the Vbb level. The voltage of node N1 varies proportionately to the mentioned variation of the voltage in the level detector, and current Ictl also varies. Therefore, the oscillation frequency of the oscillator varies, and the Vbb level can be maintained at the predetermined level. Such a control operation may be linearly carried out in accordance with the operation state of the circuit and with the variation of the load.

The operation wave patterns of the principal signals of the circuit of FIG. 5 are the same as those illustrated in FIG. 6.

According to the present invention as described above, in order to maintain stably the back bias voltage at a predetermined level, the oscillation frequency of the oscillator may be varied in an approximately linear manner, so that an accurate control of the voltage due to load variation can be carried out during operation of the circuit. Further, while conventionally a plurality of oscillators having different frequencies are selectively used, the present invention uses only one oscillator in such a manner that the frequency is varied automatically in accordance with the operation state, thereby eliminating the need of a timing control circuit as in conventional circuits. Consequently, the bulk of the circuit may be reduced, the design of the circuit becomes easier, and the control of the back bias level can be carried out in an accurate manner.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A voltage generator for generating an internal voltage of a desired level on a terminal in a semiconductor device, comprising:

a charge pump coupled to the terminal and generating a voltage by rectifying clock signals;

a variable frequency oscillator coupled to the charge pump and providing variable oscillation frequency clock signals to the charge pump in accordance with one or more control signals; and a voltage control means for detecting the level of voltage maintained on the terminal and generating control signals for controlling the frequency of the variable frequency oscillator;

wherein the voltage control means comprises:

a voltage level detector generating a signal voltage in response to detecting the difference between a reference voltage level and the internal voltage; and an oscillation control section receiving the signal voltage of the voltage level detector and generating the one or more control signals in the form of a current flowing in accordance with the magnitude of the signal voltage; and wherein the oscillation control section comprises:

an MOS transistor receiving the signal voltage into the gate of the MOS transistor, wherein a voltage detecting current flows in response to the voltage detecting current; and a current mirror generating a control current proportionately to the voltage detecting current.

2. The generator of claim 1, wherein the variable frequency oscillator comprises:

an oscillator comprising an odd number of inverting devices; and a power control means for controlling the supply of power from a power source to the inverting devices in accordance with the one or more control signals, whereby the oscillation frequency of the clock signals is controlled by the one or more control signals.

3. The generator of claim 2, wherein the oscillation frequency of the clock signals is controlled in an approximately linear manner by the one or more control signals.

4. The generator of claim 2, wherein the power control means is characterized in that an nMOS transistor is disposed between the inverting devices and the power source, wherein the current supplied to the inverting devices is controlled by the gate voltage of the MOS transistor, wherein the gate voltage of the MOS transistor varies in response to the control signals.

5. The generator of claim 4, wherein:

the inverting devices comprise inverters consisting of series-connected pMOS transistors and nMOS transistors; and the power control means comprises a pMOS transistor between the power source and the pMOS transistors of the inverters, and an nMOS transistor disposed between a reference terminal and the nMOS transistors of the inverters;

wherein the control signals are supplied to the gates of the respective transistors of the power control means.

6. The generator of claim 1, wherein the current mirror comprises:

a first current mirror receiving the voltage detecting current and generating the control current in accordance with the voltage detecting current; and a second current mirror receiving the control current and generating a voltage controlling the oscillation frequency of the clock signals.

7. The generator of claim 6, wherein the first current mirror comprises two pMOS transistors, and the second current mirror comprises two nMOS transistors.

8. The generator of claim 1, wherein a driving circuit is coupled between the variable frequency oscillator and the charge pump.

9. The generator of claim 8, wherein the driving circuit comprises a buffer, wherein a current limiter is disposed between the buffer and the power source.

10. The generator of claim 9, wherein the current limiter comprises an MOS transistor receiving a control signal from the voltage control means.

11. The generator of claim 1, wherein the voltage level detector comprises a plurality of PMOS transistors and a plurality of nMOS transistors connected in series, wherein a first pMOS transistor is coupled to the power source, and a last nMOS transistor is coupled to the terminal.

12. A voltage generator for generating an internal voltage of a desired level on a terminal in a semiconductor device, comprising:

a charge pump coupled to the terminal and generating a voltage by rectifying clock signals;

a variable frequency oscillator coupled to the charge pump and providing variable oscillation frequency clock signals to the charge pump in accordance with one or more control signals; and a voltage control means for detecting the level of voltage maintained on the terminal and generating control signals for controlling the frequency of the variable frequency oscillator;

wherein the variable frequency oscillator comprises:

a first series of an odd number of inverting devices, wherein the output of a last inverting device of the first series is coupled to a set input of a flip-flop, and the input of a first inverting device of the first series is coupled to a first output of the flip-flop; and a second series of an odd number of inverting devices, wherein the output of a last inverting device of the second series is coupled to a reset input of the flip-flop, and the input of a first inverting device of the second series is coupled to a second output of the flip-flop.

13. The generator of claim 12, wherein the power source is applied to at least a first inverting device in a controlled manner, wherein a capacitor is coupled between the output of the inverting device and a reference potential, wherein the oscillation frequency of the clock signals varies in accordance with the capacitance of the capacitor and with the power applied by the power supply.

14. The generator of claim 13, wherein the inverting device is an inverter comprising a pMOS transistor and an nMOS transistor connected in series.

15. The generator of claim 13, wherein the voltage control means comprises:

a voltage level detector generating a signal voltage in response to detecting the difference between a reference voltage level and the internal voltage; and an oscillation control section receiving the signal voltage from the voltage level detector and generating the one or more control signals in the form of a current flowing in accordance with the magnitude of the signal voltage.

16. The generator of claim 15, wherein the oscillation control section, comprise:

an MOS transistor receiving the signal voltage into the gate of the MOS transistor, wherein a voltage detecting current flows in response to the voltage detecting current; and a current mirror generating a control current proportionately to the voltage detecting current.

17. The generator of claim 16, wherein the current mirror comprises two pMOS transistors.

18. The generator of claim 12, wherein a driving circuit is coupled between the variable frequency oscillator and the charge pump, wherein the clock signals applied to the change pump comprise a rectangular wave.

19. The generator of claim 15, wherein the voltage level detector comprises a plurality of pMOS transistors and a plurality of nMOS transistors connected in series, and wherein a first pMOS transistor is coupled to the power source, and a last nMOS transistor is coupled to the terminal.

20. The generator of claim 13, wherein the inverting device to which the power source is applied in a controlled manner is the first inverting device, and the first inverting device receives a control current through the current mirror of the oscillation control section.

* * * * *